United States Patent
La Rosa

(10) Patent No.: US 7,492,639 B2
(45) Date of Patent: Feb. 17, 2009

(54) EEPROM MEMORY HAVING AN IMPROVED RESISTANCE TO THE BREAKDOWN OF TRANSISTORS

(75) Inventor: Francesco La Rosa, Rousset (FR)

(73) Assignee: STMicroelectronics S.A., Montrouge (FR)

( * ) Notice: Subject to any disclaimer, the term of this patent is extended or adjusted under 35 U.S.C. 154(b) by 70 days.

(21) Appl. No.: 11/754,707

(22) Filed: May 29, 2007

(65) Prior Publication Data
US 2008/0002474 A1    Jan. 3, 2008

(30) Foreign Application Priority Data
May 29, 2006    (FR)    .................... 06 04703

(51) Int. Cl.
G11C 16/04    (2006.01)
(52) U.S. Cl. .................... 365/185.18; 365/185.29; 365/185.3
(58) Field of Classification Search ............ 365/185.18, 365/185.29, 185.3
See application file for complete search history.

(56) References Cited

U.S. PATENT DOCUMENTS

| | | | | |
|---|---|---|---|---|
| 6,064,595 | A | 5/2000 | Logie et al. | 365/185.18 |
| 6,411,548 | B1 * | 6/2002 | Sakui et al. | 365/185.17 |
| 6,522,585 | B2 * | 2/2003 | Pasternak | 365/185.21 |
| 7,245,534 | B2 * | 7/2007 | Goda et al. | 365/185.17 |

FOREIGN PATENT DOCUMENTS

| | | |
|---|---|---|
| EP | 0 484 298 | 5/1992 |
| WO | 97/19452 | 5/1997 |

* cited by examiner

Primary Examiner—Huan Hoang
(74) Attorney, Agent, or Firm—Lisa K. Jorgenson; Robert Iannucci; Seed IP Law Group PLLC

(57) ABSTRACT

The present invention relates to a method for programming or erasing memory cells that include a selection transistor connected to a floating-gate transistor. According to the method, a non-zero compensation voltage is applied to the gate of a transistor not involved in the programming or erasing process so as to increase a breakdown threshold of the transistor, and an inhibition voltage is applied to the gate or to a terminal of at least one floating-gate transistor connected to the transistor having its breakdown threshold increased to inhibit a phenomenon of soft programming or soft erase of the floating-gate transistor.

19 Claims, 9 Drawing Sheets

PROGRAM

ERASE

PROGRAM

ERASE

PROGRAM

ERASE

EEPROM MEMORY HAVING AN IMPROVED RESISTANCE TO THE BREAKDOWN OF TRANSISTORS

BACKGROUND OF THE INVENTION

1. Field of the Invention

The present invention relates to EEPROM memories (electrically erasable and programmable memories) and to an improvement in the breakdown threshold of transistors in the presence of a high programming or erase voltage.

2. Description of the Related Art

FIG. 1A is the wiring diagram of a classic EEPROM memory cell 10. The memory cell comprises a floating-gate transistor FGT and a selection transistor ST. The transistor ST comprises a gate G, a drain D (drain terminal) and a source S (source terminal). The transistor FGT also comprises a control gate CG, a drain D and a source S, and also comprises a floating gate FG. The source S of the selection transistor ST is connected to the drain D of the transistor FGT.

FIG. 1B is a cross-section of an example of an embodiment of the memory cell 10 according to the double polysilicon layer technique, and FIG. 1C shows the memory cell seen from above. Three n+ doped regions 3, 4, 5 are formed in a p-type substrate 1. The region 3 forms the source region of the transistor FGT, the region 4 forms the drain region of the transistor FGT and the source region of the transistor ST, and the region 5 forms the drain region of the transistor ST. The floating gate FG of the transistor FGT is formed by a polysilicon pad POLY1A. The gate G of the transistor ST is formed by the intersection of a line of polysilicon POLY1B with the doped regions 4, 5, the line POLY1B forming a word line WL linking the gates of various other selection transistors (not represented). Similarly, the control gate CG of the transistor FGT is formed by the intersection of a line of polysilicon POLY2 with the doped regions 3, 4, the line POLY2 forming a control gate line CGL linking the control gates of various other transistors FGT (not represented). These various polysilicon parts are insulated from the substrate and insulated from one another by a dielectric 2, generally silicon dioxide. Finally, a source contact SC formed above the region 3 links the source of the transistor FGT to a source line SL (not represented). A drain contact DC formed above the region 5 links the drain of the transistor ST to a bit line BL (not represented).

A datum is saved or erased in the memory cell 10 by injecting electric charges into the floating gate FG of the transistor FGT or by extracting electric charges from the floating gate FG. The injection or extraction of charges changes the threshold voltage of the transistor FGT that is then detected by a sense amplifier, the function of which is to transform the "threshold voltage" information into a binary datum, for example equal to 1 when the threshold voltage is negative and equal to 0 when the threshold voltage is positive.

The two processes of injecting and extracting electric charges are performed by tunnel effect (Fowler-Nordheim effect). For this purpose, the floating gate FG has a region that extends above the drain region 4 and in which the separating layer of dielectric 2 is made thinner to form a tunnel window TW. To program the memory cell (injection of charges), a high programming voltage is applied to the drain region of the transistor FGT, via the transistor ST, while the control gate CG is taken to a zero or negative potential. To erase the memory cell, a high erase voltage is applied to the control gate CG while the source region 3 is taken to a zero or negative potential.

The performances of an EEPROM memory are directly linked to the time of injecting or extracting electric charges into floating gates of the memory cells. An efficient memory must have a programming or erasing time as short as possible. This time depends on three parameters that are involved in the transfer of charges by tunnel effect:

1) the thickness of the dielectric forming the tunnel window TW,
2) the value of the high programming or erase voltage,
3) the floating gate coupling factor, i.e., the ratio between, firstly, the capacitive coupling between the floating gate and the control gate and, secondly, the capacitive coupling between the floating gate, the drain, the source, and the substrate.

The thickness of the tunnel dielectric cannot be reduced below a certain threshold, above which the memory cells would have losses of electric charges ("retention loss") eventually causing a corruption of data (an EEPROM memory being supposed to keep the data saved for several years). It follows that the two main parameters on which the performances of an EEPROM memory rely are the coupling factor and the value of the high programming or erase voltage.

The greater the coupling factor, the faster the programming or erasing process for a determined programming or erase voltage. However, the coupling factor tends to decrease when the size of the memory cells decreases (transistor FGT and ST gate width to length W/L ratio). As the size of transistors is constantly decreasing with the improvement of microelectronic techniques, the paradoxical result is that the new generation memories, having smaller memory cells, need higher programming and erase voltages than the previous generation memories. Thus, the coupling factor represents a major obstacle to the decrease in the size of EEPROM memories without increasing the programming or erasing time.

After all is said and done, the obvious solution to preserve the programming and erasing time of an EEPROM memory the size of the transistors of which must be reduced, is to increase the value of the high programming or erase voltage. However, another technological constraint is also faced, in that MOS transistors have a breakdown threshold which determines the maximum value of the erase or programming voltage that can be applied to interconnected memory cells.

In FIG. 1B, the reference Di designates a breakdown region of a selection transistor ST. This region is a PN substrate-drain junction (and more particularly channel-drain) forming a reverse-biased diode. When the drain region receives a programming voltage while the substrate 1 is linked to the ground (which, in principle, is always the case), the diode D$i$ reaches its breakdown point (threshold voltage of the reverse-biased diode) in the vicinity of a value that is in the order of 12V in the EEPROM memories marketed by the applicant. Thus, the programming voltage cannot be taken above this value.

For a better understanding of the impact of the breakdown phenomenon on the programming and erasing process, FIG. 3 represents an EEPROM memory of the word-erasable type, having memory cells being programmed. It can be seen that the selection transistors ST of vertically aligned memory cells have their respective drains connected to common bit lines BL. For example, selection transistors ST(i,7,k) and ST(i−2, 7,k) are connected to a same bit line BL(7,k). Thus, when a high programming voltage Vpp1 is applied to the bit line BL(7,k) to program for example the memory cell comprising the selection transistor ST(i,7,k), this transistor receives a high value gate voltage Vp1 to let the high voltage Vpp1 through while all the other selection transistors connected to this bit line, particularly the transistor ST(i−2,7,k), receive a zero gate voltage and are in the off state. These transistors not involved in the programming process have a lower breakdown threshold than that of the transistor ST(i,7,k) and thus limit the maximum voltage Vpp1 that can be applied to the bit line.

As another example, FIG. 4 represents an EEPROM memory identical to the one in FIG. 3 but having memory cells being erased. The memory comprises control gate transistors, for example transistors CGT(i–2,k) and CGT(i,k), the drains of which are connected to a common control gate line, for example a line CGL(k). When a high erase voltage Vpp1 is applied to the control gate line CGL(k) to erase for example memory cells linked to the transistor CGT(i,k), this transistor receives a high value gate voltage Vp1 to let the high voltage through while all the other transistors linked to this control gate line, particularly the transistor CGT(i–2,k), receive a zero gate voltage and are in the off state. These transistors that are not involved in the erasing process have a breakdown threshold lower than that of the transistor CGT(i,k) and thus limit the maximum voltage Vpp1 that can be applied to the control gate line.

BRIEF SUMMARY OF THE INVENTION

Therefore, the present disclosure provides a method of increasing the breakdown threshold of transistors connected to a line receiving a high programming or erase voltage.

The present disclosure also provides an EEPROM memory structure, particularly a word-erasable memory, enabling the breakdown threshold of transistors connected to a line receiving a high programming or erase voltage to be increased.

The present disclosure notes that the breakdown voltage of a MOS transistor increases almost proportionally to the gate voltage applied to the transistor. More particularly, experiments have shown that when the gate voltage of a transistor is different from zero, an accumulation of electric charges is created in the channel of the transistor that pushes back the breakdown threshold of the drain-substrate diode. It has been particularly observed that the application of a compensation voltage of 5 V to the gate of a transistor receiving a programming or erase voltage on its drain enabled the breakdown threshold of the transistor to be increased by 2 V, to 14 V for example instead of 12 V.

A first principle and step of the present disclosure is thus to apply a non-zero compensation voltage to the gate of the transistors that are not involved in the programming or erasing process but that receive a programming or erase voltage on their drain.

However, applying a non-zero gate voltage to a transistor not involved in the programming or erasing process means that this transistor will go into transmission state and will transfer a fraction of the high voltage onto the drain of the floating-gate transistor to which it is connected (if this is a selection transistor) or onto the gates of a set of floating-gate transistors (if this is a control gate transistor). In these conditions, the floating-gate transistor(s) in question are exposed to a risk of spurious programming or erasing referred to as soft programming or soft erase.

To overcome this disadvantage, another step of the present disclosure is to apply an inhibition voltage to the source or to the gate of the floating-gate transistor(s) in question, to prevent the phenomenon of soft programming or soft erase.

More particularly, the present disclosure relates to a method for programming or erasing memory cells each having a selection transistor connected to a floating-gate transistor, each selection and floating gate transistor having a gate, a first conduction terminal and a second conduction terminal, the method including a step of simultaneously applying a high programming or erase voltage to at least one memory cell that must be programmed or that must be erased and to a terminal of at least one transistor not involved in the programming or erasing process. According to this embodiment, the method includes the steps of applying a non-zero compensation voltage to the gate of the transistor not involved in the programming or erasing process, so as to increase a breakdown threshold of the transistor, and applying an inhibition voltage to the gate or to a terminal of at least one floating-gate transistor connected to the transistor having its breakdown threshold increased, to inhibit a phenomenon of soft programming or soft erase of the floating-gate transistor.

According to one embodiment, a step of programming involves the steps of applying a high programming voltage to the first terminal of at least one first selection transistor belonging to a memory cell that must be programmed and to the first terminal of at least one second selection transistor belonging to a memory cell that must not be programmed, applying the compensation voltage to the gate of the second selection transistor, so as to increase the breakdown threshold of the transistor, and applying a soft programming inhibition voltage to the gate of a floating-gate transistor linked to the second selection transistor.

According to one embodiment, the method is applied to a memory in which the memory cells are arranged in memory words, each memory word having a control gate transistor connected to the control gates of the floating-gate transistors of the word, and a step of erasing comprises the steps of applying a high erase voltage to the first terminal of at least one first control gate transistor of a first memory word that must be erased and to the first terminal of at least one second control gate transistor of a second memory word that must not be erased, applying the compensation voltage to the gate of the second control gate transistor, so as to increase the breakdown threshold of the transistor, and applying a soft erase inhibition voltage to terminals of the floating-gate transistors of the second memory word.

According to one embodiment, the method involves a step of arranging the memory cells to form a memory array having the following characteristics: the memory cells are arranged according to rows, the gates of the selection transistors of the memory cells of a same row are connected to a common word line, the first terminals of the selection transistors of the memory cells are linked to bit lines transversal to the word lines, the bit lines are grouped together into columns, the memory cells of a same column and of a same row form a memory word, each memory word includes a control gate transistor having its first terminal connected to the control gates of the floating-gate transistors of the word, the gates of the control gate transistors of the memory words belonging to a same column are connected to a common column selection line, and the first terminals of the control gate transistors of the memory words belonging to a same row are linked to a common control gate line that is parallel to the word line of the row.

According to one embodiment, the method includes a step of connecting the second terminals of the floating-gate transistors of each column to a control line common to all the floating-gate transistors of the column.

The present disclosure also relates to an electrically erasable and programmable memory having memory cells each including a selection transistor connected to a floating-gate transistor, each transistor comprising a gate, a first conduction terminal and a second conduction terminal, and circuit for simultaneously applying a high programming or erase voltage to at least one memory cell that must be programmed or that must be erased and to a terminal of at least one transistor not involved in the programming or erasing process. According to the present embodiment, the memory includes means for applying a non-zero compensation voltage to the gate of the transistor not involved in the programming or erasing process so as to increase a breakdown threshold of the transistor, and applying an inhibition voltage to the gate or to a terminal of at least one floating-gate transistor connected to the transistor having its breakdown threshold increased to inhibit a phenomenon of soft programming or soft erase of the floating-gate transistor.

According to one embodiment, the memory includes a programming circuit arranged for applying a high programming voltage to the first terminal of at least one first selection transistor belonging to a memory cell that must be programmed and to the first terminal of at least one second selection transistor belonging to a memory cell that must not be programmed, applying the compensation voltage to the gate of the second selection transistor, so as to increase the breakdown threshold of the transistor, and applying a soft programming inhibition voltage to the gate of a floating-gate transistor linked to the second selection transistor.

According to one embodiment, the gates of the selection transistors of the memory cells are connected to word lines, the memory cells are arranged in memory words, each memory word comprising a control gate transistor connected to the control gates of the floating-gate transistors of the word, and the memory includes a circuit for erasing memory cells arranged for applying a high erase voltage to the first terminal of at least one first control gate transistor of a first memory word that must be erased and to the first terminal of at least one second control gate transistor of a second memory word that must not be erased, applying the compensation voltage to the gate of the second control gate transistor so as to increase the breakdown threshold of the transistor, and applying a soft erase inhibition voltage to terminals of the floating-gate transistors of the second memory word.

According to one embodiment, the memory cells are arranged in a memory array having the following structural characteristics: the memory cells are arranged according to rows, the gates of the selection transistors of the memory cells of a same row are connected to a common word line, the first terminals of the selection transistors of the memory cells are linked to bit lines transversal to the word lines, the bit lines are grouped together into columns, the memory cells of a same column and of a same row form a memory word, each memory word has a control gate transistor having its first terminal connected to the control gates of the floating-gate transistors of the word, the gates of the control gate transistors of the memory words belonging to a same column are connected to a common column selection line, and the first terminals of the control gate transistors of the memory words belonging to a same row are linked to a common control gate line that is parallel to the word line of the row.

According to one embodiment, the second terminals of the floating-gate transistors of each column are connected to a control line common to all the floating-gate transistors of the column.

In accordance with another embodiment of the present disclosure, a method for programming and erasing memory cells is provided, the memory cells having a selection transistor connected to a floating gate transistor, the method including applying a non-zero compensation voltage to the gate of a transistor not involved in the programming or erasing process, the non-zero compensation voltage adapted to increase a breakdown threshold of the transistor; and applying an inhibition voltage to a gate of at least one floating gate transistor connected to the transistor having its breakdown threshold increased to program the floating gate transistor or applying an inhibition voltage to a terminal of at least one floating gate transistor connected to the transistor having its breakdown threshold voltage increased to inhibit a soft erase of the floating gate transistor.

In accordance with another aspect of the foregoing embodiment, the method includes applying an erase voltage to a first terminal of at least one first control gate transistor of the memory word to be erased and to a first terminal of at least one second control gate transistor of a second memory word that must not be erased; applying a compensation voltage to the gate of the second control gate transistor to increase the breakdown threshold of the transistor; and applying a soft erase inhibition voltage to terminals of the floating gate transistors of the second memory word.

In accordance with another aspect of the foregoing embodiment, the method includes applying a high programming voltage to a first terminal of the selection transistor belonging to the memory cell to be programmed and to the first terminal of at least one second selection transistor belonging to a memory cell in the memory word that must not be programmed; and applying the compensation voltage to the gate of the second selection transistor so as to increase the breakdown threshold of the selection transistor; and applying a soft programming inhibition voltage to the gate of a floating gate transistor linked to the second selection transistor.

In accordance with another embodiment of the present disclosure, a memory is provided that includes a plurality of memory cells, each memory cell comprising a selection transistor coupled to a floating gate transistor, each of the selection and floating gate transistors comprising a gate, a first conduction terminal, and a second conduction terminal; and a circuit for simultaneously applying a high-programming voltage and an erase voltage to at least one memory cell that is to be programmed or that is to be erased, and to a terminal of at least one transistor not involved in the programming and erasing processes, the circuit adapted to apply a non-zero compensation voltage to the gate of the transistor not involved in the programming or in the erasing process in order to increase a breakdown threshold of the transistor and to apply an inhibition voltage to the gate of at least one floating gate transistor connected to the transistor having its breakdown threshold increased in order to inhibit a phenomenon of soft programming and, during the erasing process, applying the inhibition voltage to a conduction terminal of the at least one floating gate transistor connected to the transistor having its breakdown threshold increased to inhibit soft erase of the floating gate transistor.

BRIEF DESCRIPTION OF THE SEVERAL VIEWS OF THE DRAWING(S)

These and other objects, advantages and features of the present invention shall be presented in greater detail in the following description of the method of programming and erasing memory cells according to the present invention, and of an architecture of EEPROM memory enabling the implementation of this method, given in relation with, but not limited to the following figures, in which:

FIGS. 1A, 1B, 1C described above respectively represent the wiring diagram of an EEPROM memory cell and an example of an embodiment of the memory cell on silicon substrate, seen in a cross-section and seen from above;

DETAILED DESCRIPTION OF THE INVENTION

An example of implementation of the method of the present invention in a word-erasable memory will be described below, after analyzing in greater detail, in the context of a structure of a word-erasable memory, the technical problem that the present disclosure solves.

Figure 1A:
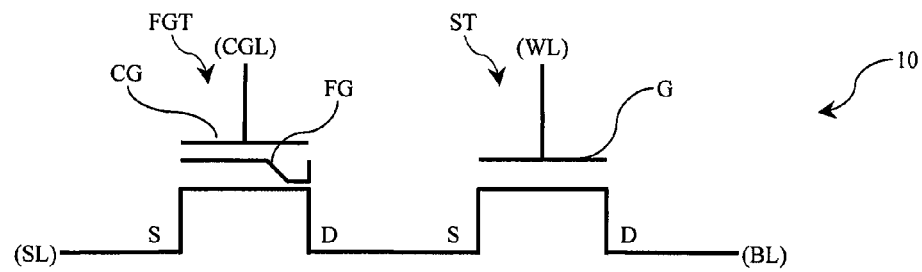
Figure 1B:
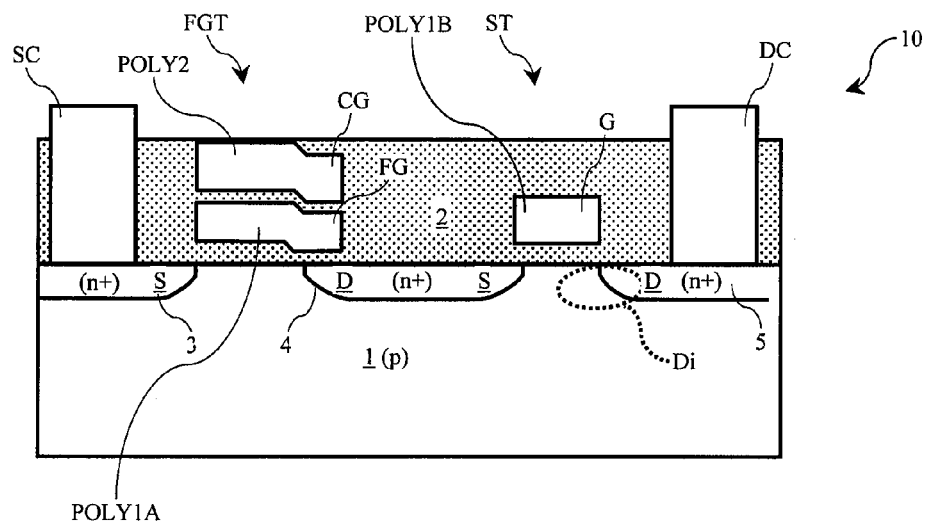
Figure 1C:
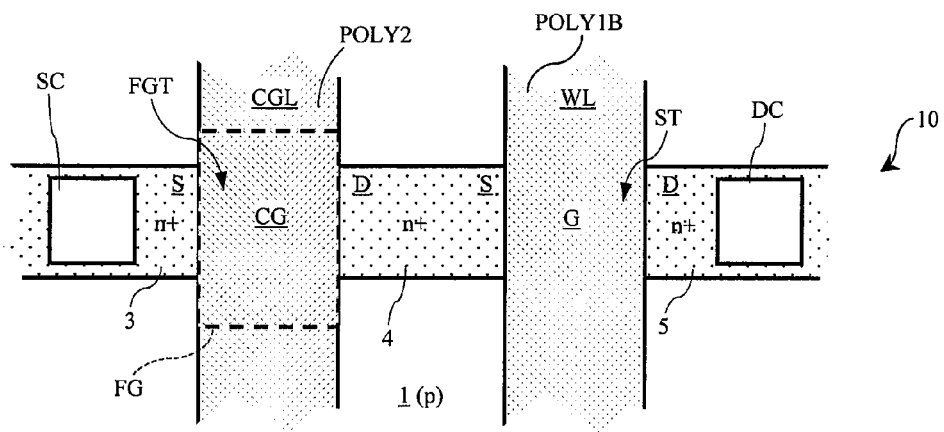
Figure 2:
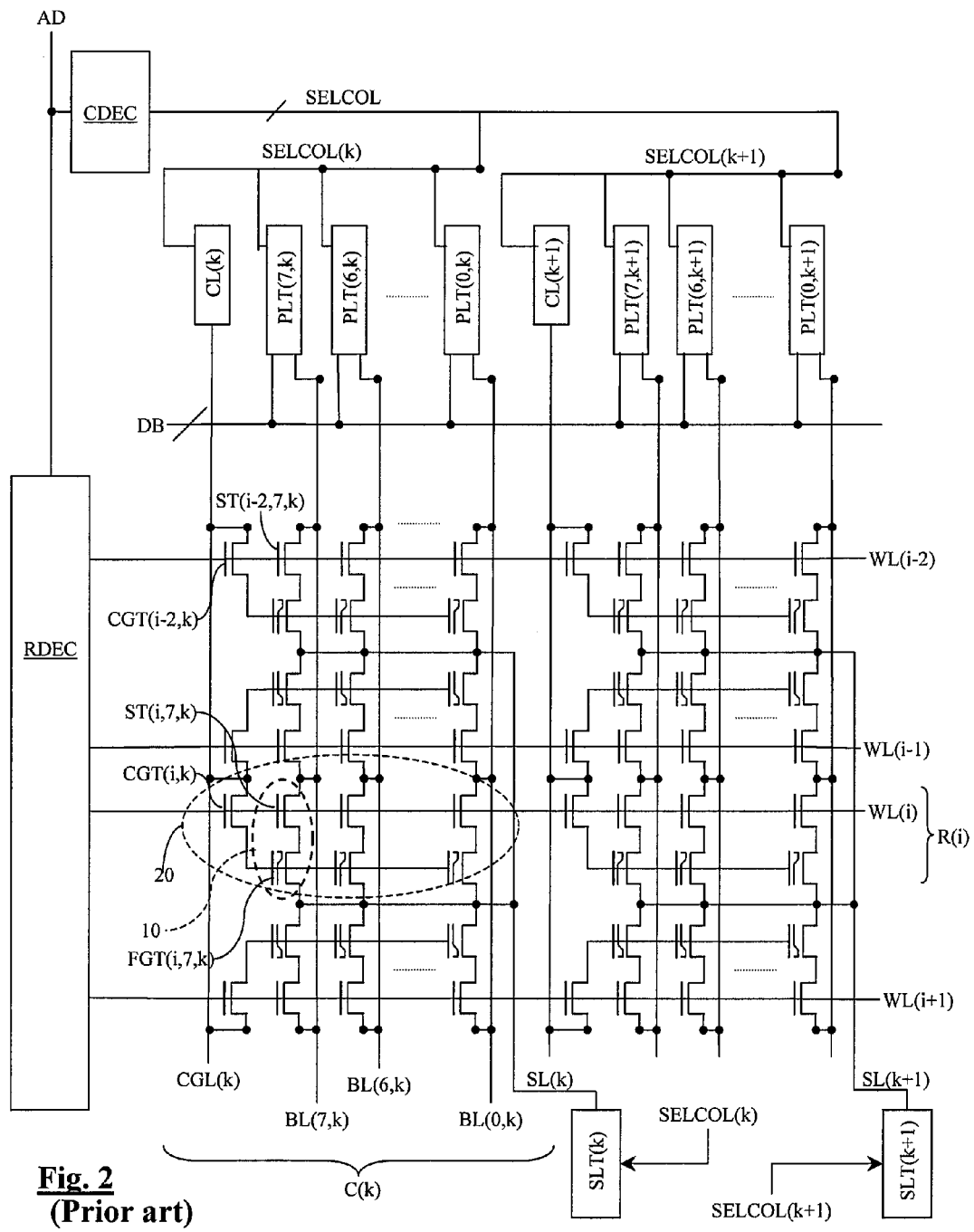
FIG. 2 represents a classic architecture of a word-erasable EEPROM memory.

Architecture of a Classic Word-Erasable Memory and Detailed Analysis of the Technical Problem FIG. 2 represents the classic architecture of a word-erasable EEPROM memory. The memory includes a memory array consisting of memory cells arranged along rows referenced R(i), "i" being the rank of a row. As described above, each memory cell 10 includes a selection transistor ST and a floating-gate transistor FGT. The drains of the selection transistors ST of the memory cells are connected to bit lines BL(j,k), "j,k" being the rank of the bit lines with j ranging here from 0 to 7. The gates of the selection transistors ST are connected to word lines WL(i), the memory cells of a same row R(i) having the gate of their selection transistor ST connected to the same word line WL(i).

The bit lines are grouped together into columns C(k), a column of rank k here involving eight bit lines BL(0,k) to BL(7,k). The memory cells of a same row R(i) and of a same column C(k), here eight memory cells, are linked to a control gate line CGL(k) through a control gate transistor CGT(i,k). Each control gate line CGL(k) is common to all the memory cells of the column C(k) of corresponding rank. Thus, a memory word 20 belonging to a row R(i) and to a column C(k) has eight memory cells and a control gate transistor CGT(i,k). This control gate transistor has its source linked to the control gate line CGL(k), its gate connected to the corresponding word line WL(i), and its drain is connected to the control gates of the floating-gate transistors FGT of the word. Finally, the sources of the floating-gate transistors FGT of the words belonging to a same column C(k) are connected to a common source line SL(k).

The phases of programming or erasing memory cells are controlled by means of the following elements:
programming latches PLT(j,k) with eight latches PLT(0,k) to PLT(7,k) per column, each latch being connected to a bit line of corresponding rank,
column latches CL(k) with one latch per column, each column latch being connected to the control gate line CGL(k) of the column of corresponding rank,
source latches SLT(k) with one latch per column, each source latch being connected to the source line SL(k) of the column of corresponding rank,
a column decoder CDEC receiving a word address AD and supplying, according to this address, column selection signals SELCOL(k) to the programming latches, the column latches and the source latches, and
a row decoder RDC1 to bias the word lines WL(i) and program- or erase-select a word line according to the word address AD.

Each programming latch PLT(j,k) has an input linked to a data bus DB and applies to the bit line in question a voltage that can have three values: HZ (floating potential), 0 V (ground) and Vpp1 (high programming voltage). Each column latch CLT(k) applies to the control gate line in question CGL(k) a control gate voltage that can have three values: HZ (floating potential), 0 V (ground) and Vpp1 (high erase voltage, generally equal to the high programming voltage). Each source latch SLT(k) applies to the source line in question a source voltage equal to HZ or to 0 V.

The row decoder RDEC applies to each word line WL(i) a word line voltage that can have three values: 0 V or Vp1, Vp1 being a gate voltage enabling the voltage Vpp1 to be let through a control gate transistor (erase) or through a selection transistor (programming). The voltage Vp1 is for example equal to 15 V if the voltage Vpp1 is equal to 12V.

Reading voltages applied to the memory array will not be described here for the sake of simplicity, as the present disclosure does not relate to the reading of the memory cells.

a—Programming Memory Cells

Figure 3:
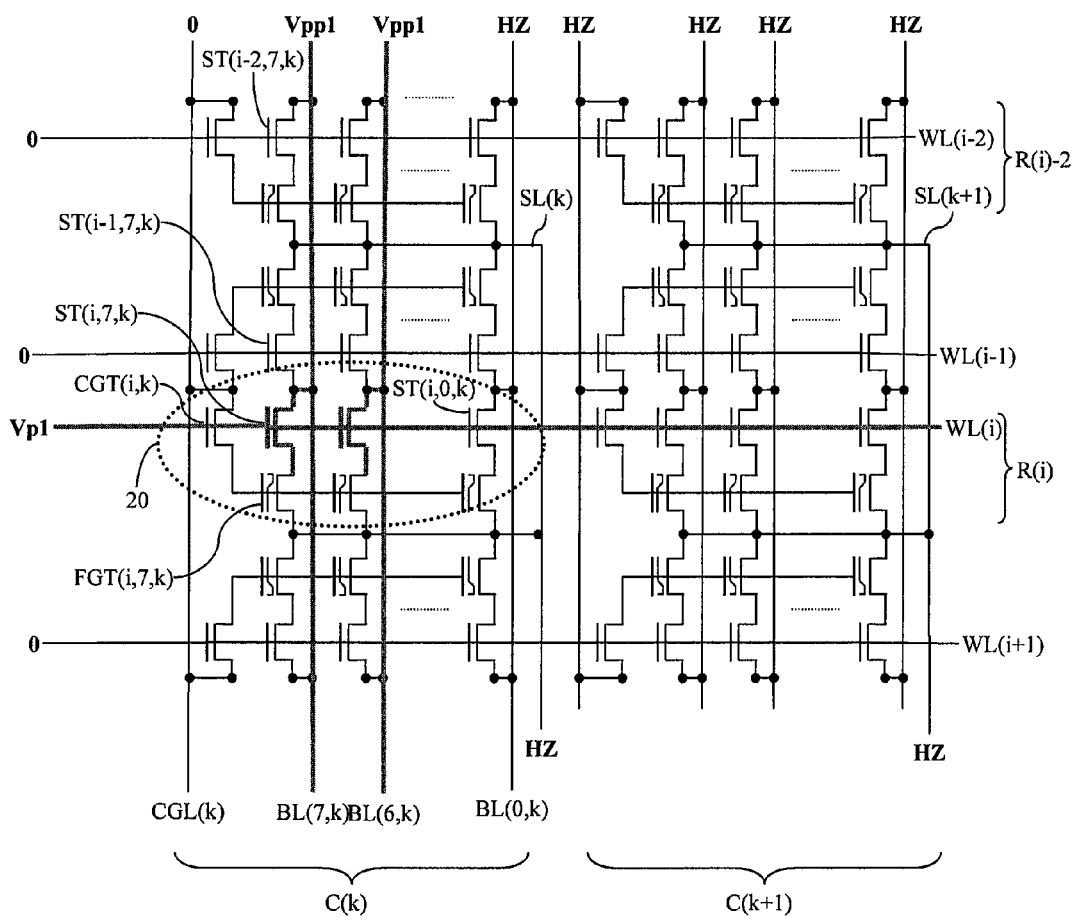
FIGS. 3 and 4 represent classic combinations of voltages applied to the EEPROM memory in FIG. 2, respectively during a phase of programming and a phase of erasing memory cells.

FIG. 3 partially described above represents a combination of voltages applied to the memory array in FIG. 2 to program memory cells. The memory cells to be programmed chosen as an example are here two memory cells of respective ranks i,7,k and i,6,k of the memory word 20.

The following voltages can be distinguished:
voltage applied to the word line in question WL(i): Vp1
voltage applied to the other word lines: 0 V
voltage applied to the bit lines in question BL(7,k), BL(6,k): Vpp1
voltage applied to the other bit lines: HZ (belonging to the same column and to the other columns)
voltage applied to the control gate line in question CGL(k): 0 V
voltage applied to the other control gate lines of the memory array: HZ
voltage applied to the source line SL(k) in question: HZ
voltage applied to the other source lines SL(k) of the memory array: HZ.

Thus, the selection transistors ST(i,7,k), ST(i,6,k) of the two memory cells in question are in the transmission state and apply the voltage Vpp1 to the drains of the floating-gate transistors FGT(i,7,k), FGT(i,6,k), the gate of which receives the voltage 0 V, the sources having a high impedance.

Simultaneously, all the other access transistors linked to the bit lines in question BL(7,k), BL(6,k) receive the voltage Vpp1 on their drain and the voltage 0 V on their gate, for example the transistor ST(i–2,7,k) of the line WL(i–2). These transistors are blocked but impose their breakdown threshold on the bit line, such that the programming voltage Vpp1 cannot be taken above this value.

b—Erasing Memory Cells

Figure 4:
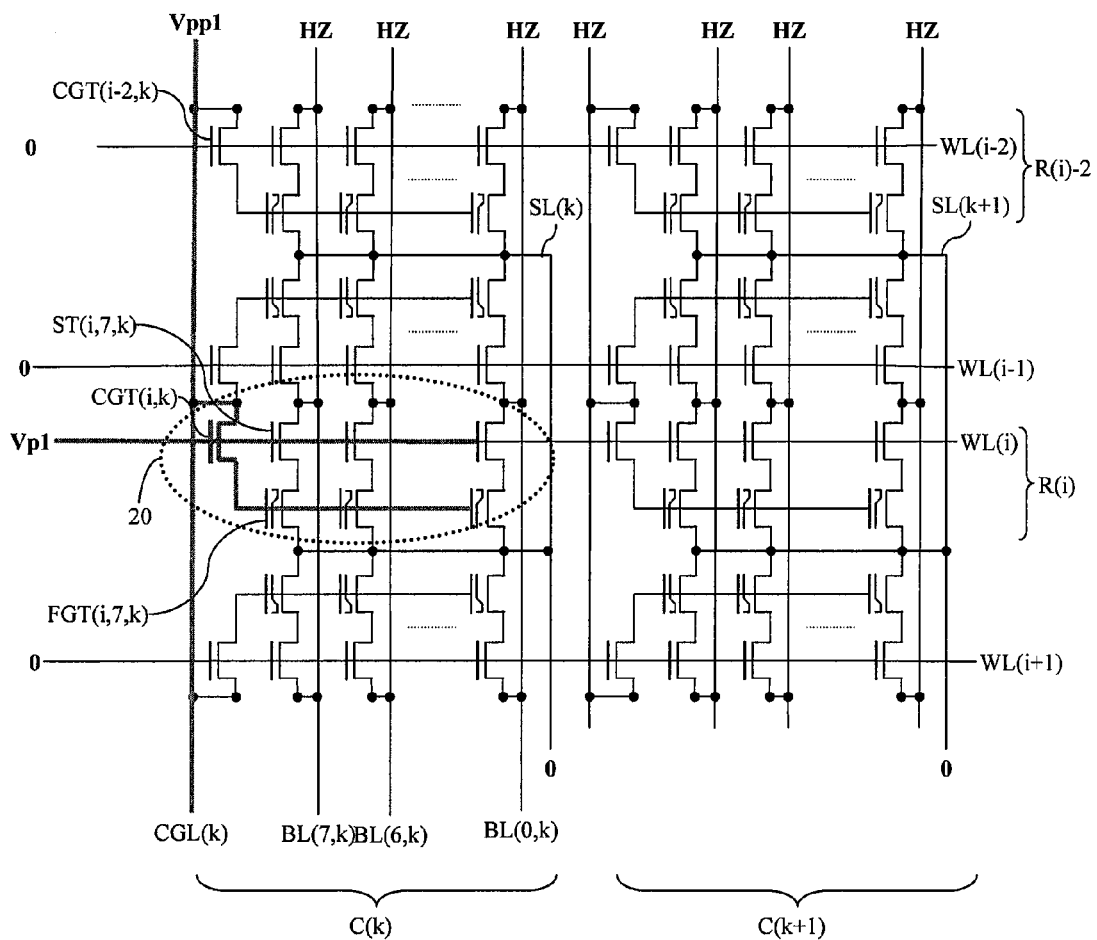

FIG. 4 partially described above represents a combination of voltages applied to the memory array in FIG. 2 to erase memory cells. The memory cells to be erased chosen as an example are here the memory cells of the memory word 20.

The following voltages can be distinguished:
voltage applied to the word line in question WL(i): Vp1
voltage applied to the other word lines: 0 V voltage applied to the bit lines of the column in question: HZ voltage applied to the other bit lines of the memory array: HZ voltage applied to the control gate line in question CGL(k): Vpp1 voltage applied to the other control gate lines of the memory array: HZ voltage applied to the source line SL(k) in question: 0 V voltage applied to the other source lines SL(k) of the memory array: HZ.

Thus, the control gate transistor CGT(i,k) of the memory word 20 is in the transmission state and applies the voltage Vpp1 to the gates of the floating-gate transistors of the memory word, the drain of which is put to high impedance and the sources of which are on 0 V.

Simultaneously, all the other control gate transistors linked to the control gate line CGL(k) receive the voltage Vpp1 on their drain and the voltage 0 V on their gate, for example the transistor CGT(i-2,7,k) of the line WL(i-2). These transistors are blocked but impose their breakdown threshold on the control gate line CGT(k), such that the erase voltage Vpp1 cannot be taken above this value.

First Aspect of the Method According to the Present Disclosure

According to a first aspect of the present disclosure, a compensation voltage is applied to the gates of the transistors not involved in the programming or erasing process but receiving the high voltage on their drain. As it has just been seen, these are the selection transistors, during the programming phases, and the control gate transistors, during the erasing phases. This aspect of the present disclosure enables the breakdown threshold of these transistors to be increased, so that a higher value programming or erase voltage can be used.

More particularly, the voltages provided by the method of the present disclosure are the following:

Vc: compensation voltage, for example 5 V to raise the breakdown threshold of the transistors by 2 V, Vpp2: high programming or erase voltage greater than the voltage Vpp1, for example 14 V instead of 12 V if the voltage Vc is equal to 5V, Vp2: high value gate voltage greater than Vp1 enabling the high voltage Vpp2 to be let through, for example 17 V instead of 15 V, HZ (floating potential) and 0 V (ground).

Figure 5:
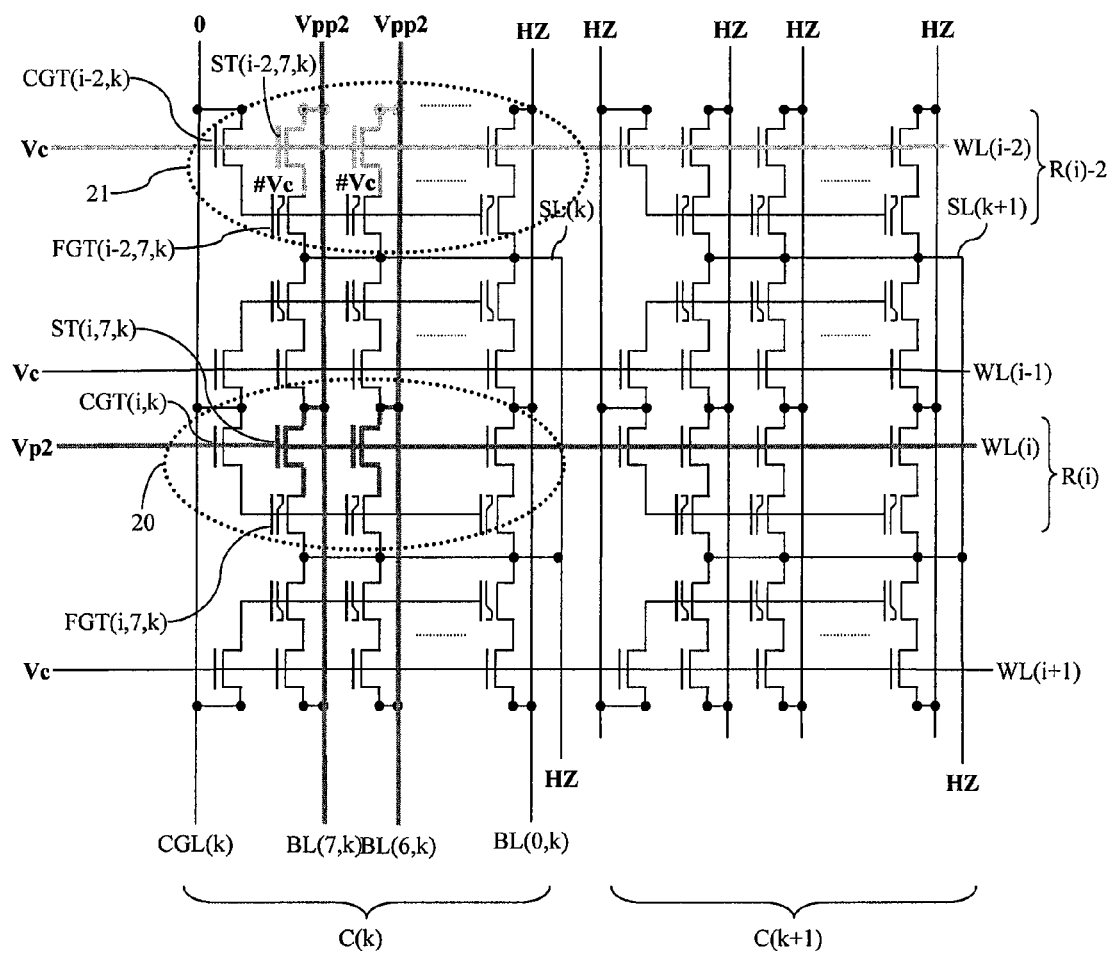
FIGS. 5 and 6 represent combinations of voltages applied to the EEPROM memory in FIG. 2, respectively during a phase of programming and a phase of erasing memory cells, and show a first aspect of the method according to the present invention.
Figure 6:
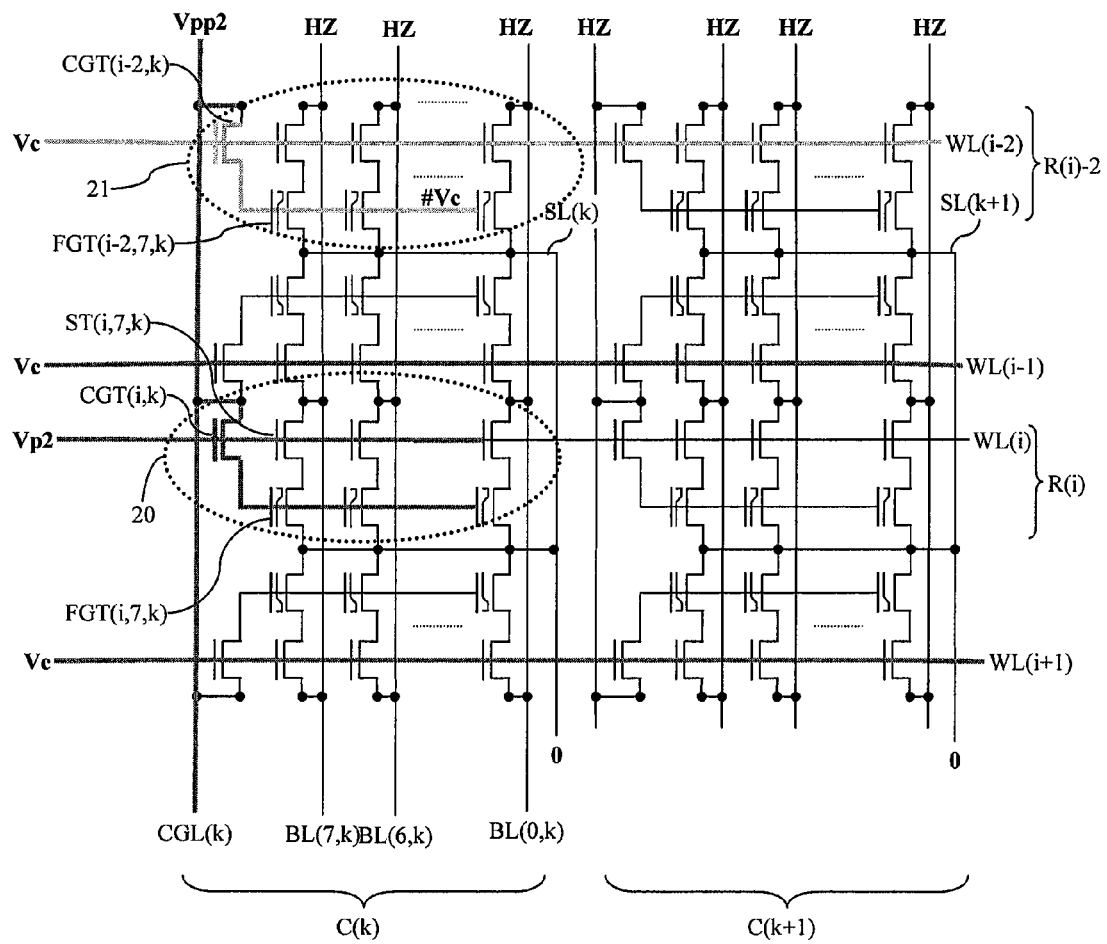

This first aspect of the present disclosure is shown in FIGS. 5 and 6.

a—Programming Memory Cells

FIG. 5 represents a combination of voltages applied to the memory array in FIG. 2 to program memory cells. The memory cells to be programmed chosen as an example are again the memory cells of ranks i,7,k and i,6,k of the memory word 20.

The following voltages can be distinguished:

voltage applied to the word line in question WL(i): Vp2 voltage applied to the other word lines of the memory array: Vc voltage applied to the bit lines in question BL(7,k), BL(6,k): Vpp2 voltage applied to the other bit lines of the memory array: HZ voltage applied to the control gate line in question CGL(k): 0 V voltage applied to the other control gate lines of the memory array: HZ voltage applied to the source line SL(k) in question: HZ voltage applied to the other source lines of the memory array: HZ.

As above, the selection transistors ST(i,7,k), ST(i,6,k) of the two memory cells in question are in the transmission state and apply the voltage Vpp2 to the drains of the floating-gate transistors FGT(i,7,k), FGT(i,6,k) the gate of which receives the voltage 0 V, their sources having a high impedance.

Simultaneously, all the other access transistors linked to the bit lines BL(7,k), BL(6,k) receive the voltage Vpp2 on their drain and the compensation voltage Vc on their gate, for example the selection transistor ST(i-2,7,k) linked to the word line WL(i-2). These transistors still impose their breakdown threshold on the bit line, but this threshold is now increased by 2 V (Vpp2-Vpp1).

b—Erasing Memory Cells

FIG. 6 represents a combination of voltages applied to the memory array in FIG. 2 to erase memory cells. The memory cells to be erased chosen as an example are again the memory cells belonging to the memory word 20.

The following voltages can be distinguished:

voltage applied to the word line in question WL(i): Vp2 voltage applied to the other word lines of the memory array: Vc, voltage applied to the bit lines of the memory array: HZ, voltage applied to the control gate line in question CGL(k): Vpp2, voltage applied to the other control gate lines of the memory array: HZ, voltage applied to the source line SL(k) in question: 0 V, voltage applied to the other source lines SL(k) of the memory array: HZ.

As above, the control gate transistor CGT(i,k) of the memory word 20 is in the transmission state and applies the voltage Vpp2 to the gates of the floating-gate transistors of the memory word, the drain of which is put to high impedance and the sources of which are on 0 V.

Simultaneously, all the other control gate transistors linked to the control gate line CGL(k) receive the voltage Vpp2 on their drain and the compensation voltage Vc on their gate, for example the transistor CGT(i-2,7,k) of the line WL(i-2). These transistors still impose their breakdown threshold on the control gate line CGT(k), but the latter is now increased by 2 V (Vpp2-Vpp1).

c—Second Aspect of the Present Disclosure—Requirements Imposed by the Classic Memory Structure In the configurations represented in FIGS. 5 and 6, the transistors receiving the compensation voltage Vc on their gate and simultaneously receiving the voltage Vpp2 on their drain are in the transmission state and apply to the drains of the corresponding floating-gate transistors (programming, FIG. 5) or to the sources of the corresponding floating-gate transistors (erasing, FIG. 6) a voltage #Vc substantially equal to Vc-Vt, Vt being the threshold voltage of these transistors, i.e., a voltage #Vc substantially equal to 4 V if the voltage Vc is equal to 5 V.

For example, in FIG. 5, the selection transistor ST(i-2,7,k) belonging to a memory word 21 applies the voltage #Vc to the gate of the transistor FGT(i-2,7,k). The other selection transistors belonging to the same memory word 21 apply this same voltage to the other floating-gate transistors of the word. In FIG. 6, the control gate transistor CGT(i-2,7,k) of the memory word 21 applies the voltage #Vc to the gate of the transistor FGT(i-2,7,k) and to the gates of the other transistors of the memory word 21.

It follows that these floating-gate transistors undergo a phenomenon of soft programming or soft erase, in other words a phenomenon of programming or erasing caused by a voltage clearly lower than the voltage Vpp2, here the voltage #Vc. This phenomenon is capable, in the long term, of causing an injection of electric charges in the floating gates or an extraction of electric charges, then causing a corruption of data.

According to a second aspect of the present disclosure, provision is made to apply an inhibition voltage equal to #Vc to the control gates of the floating-gate transistors receiving the voltage #Vc on their drain (programming phase) or to apply an inhibition voltage equal to #Vc to the sources of the floating-gate transistors receiving the voltage #Vc on their gate (erasing phase). These inhibition voltages cancel the electrical field caused by the voltage #Vc and inhibit the soft programming or soft erase process.

However, it appears that the structure of the memory in FIG. 2 does not enable such a compensation voltage to be applied. In programming phase (FIG. 5), the control gate of the floating-gate transistors indeed receives the voltage 0 V present on the control gate line CGL(k) and the application of the voltage #Vc by any switch means provided for this purpose would cause a short-circuit between the voltage #Vc and the ground.

In erasing phase (FIG. 6), it would first of all be necessary to individualize the source control lines for each memory word, so as to enable the application of the voltage #Vc to the source terminals of the memory words of the column in question C(k) while applying the voltage 0 V to the source terminals of the word to be erased, which would considerably complicate the structure of the memory.

Even if this were done, a short-circuit would nonetheless occur between the voltage #Vc and the ground through the bit lines in question. Indeed, the floating-gate transistors and the selection transistors of the memory word 20 to be erased are in the transmission state and the sources of the floating-gate transistors of the word 20 are therefore linked to the bit lines. Similarly, the floating-gate transistors and the selection transistors of the memory words not to be erased, for example the memory word 21, are also in the transmission state, and the sources of the floating-gate transistors of these memory words are therefore linked to the same bit lines. As a result, the voltage #Vc cannot be applied to the sources of the transistors of the memory words not to be erased while the sources of the memory word to be erased are grounded, as all the sources are interconnected.

Thus, a secondary object of the present disclosure is to provide an architecture of a word-erasable EEPROM memory in which the inhibition voltage #Vc can be applied to the floating-gate transistors without causing any short-circuit.

Figure 7:
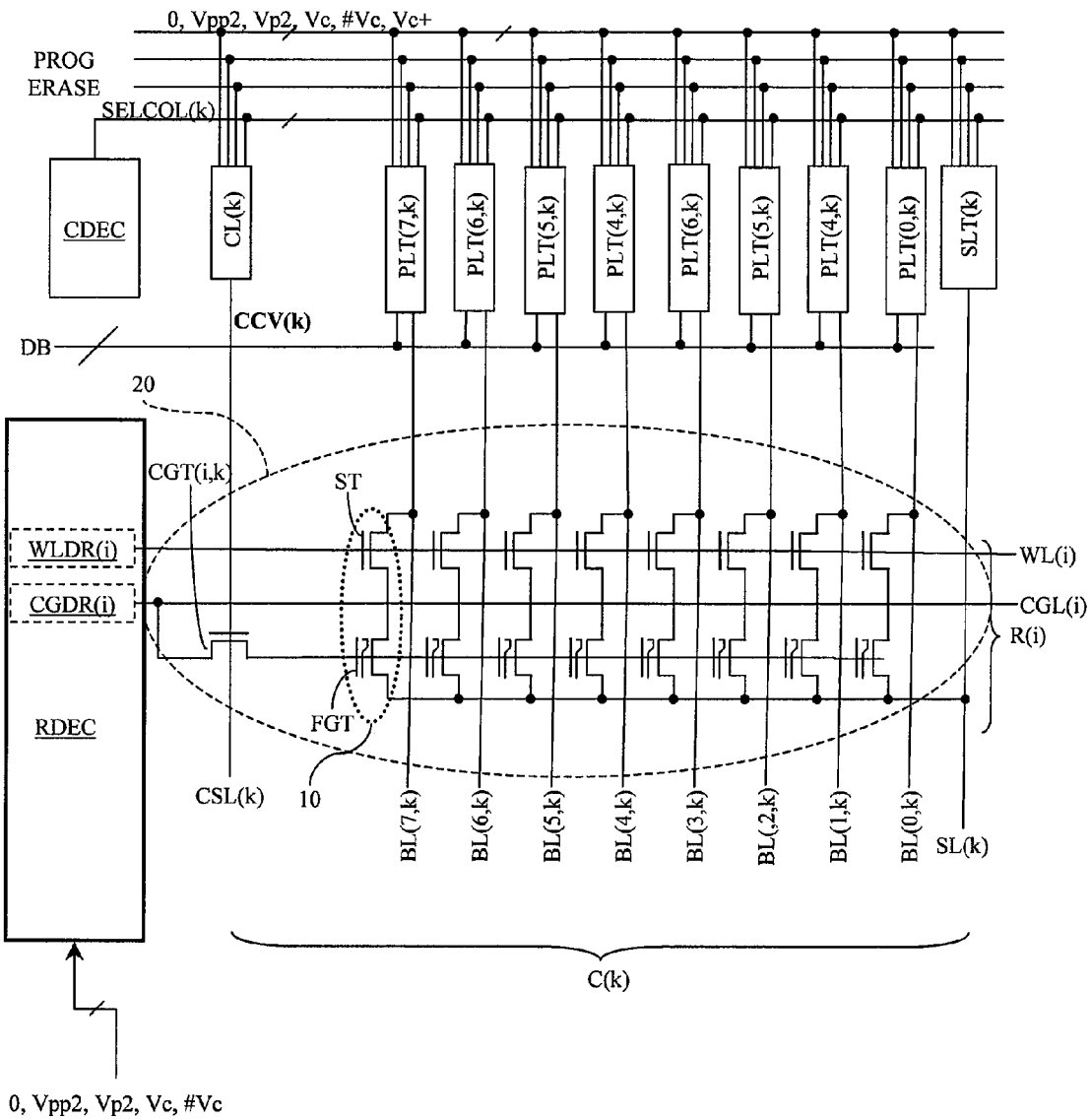
FIG. 7 represents a structure of a word-erasable EEPROM memory according to the present invention enabling the implementation of two aspects of the method according to the present invention.

Example of Architecture of a Word-Erasable Memory According to the Present Disclosure FIG. 7 represents an EEPROM memory having a memory array enabling the method according to the present disclosure to be fully implemented. The general architecture of the classic memory array is kept in that each memory cell 10 comprises a floating-gate transistor FGT and a selection transistor ST, the memory cells being grouped together in memory words each comprising eight memory cells and a control gate transistor. For the sake of simplicity of the Figure, only one memory word comprising eight memory cells and a control gate transistor is represented, here the memory word 20 of rank i,k belonging to the row R(i) and to the column C(k). The elements peripheral to the memory array enabling the voltages required to program and erase the memory cells to be applied to the memory array are also kept.

Programming latches PLT(j,k), the column latches CL(k), source line latches SLT(k), a column decoder CDEC and a row decoder RDEC are thus found again. These elements are designated by the same references as above but are substantially changed so as to enable the application to the memory array of the voltages 0 V, HZ, Vpp2, Vp2, Vc, #Vc, as well as a voltage Vc+. These elements also receive signals PROG and ERASE that enable them to find out whether the process in progress is a programming or an erasing process, so as to supply these voltages in an appropriate manner that will be described below in relation with FIGS. 8 and 9.

The memory array according to this embodiment of the present disclosure differs from the one in FIG. 2 in that the drain of the control gate transistor of each memory word, for example the drain of the transistor CGT(i,k) of the memory word 20, is no longer connected to the drains of the control gate transistors of the words belonging to the same column C(k) but is on the contrary connected to the drains of the control gate transistors of the words belonging to the same row R(i) and therefore belonging to different columns. Thus, each control gate line CGL(i) of the memory array is parallel to the word line WL(i) of corresponding rank and has a rank of index "i" instead of a rank of index "k". As another modification of the memory array, the control gate lines are no longer driven by column latches but by the row decoder RDEC. The latter thus comprises for each row R(i) to be controlled, a word line driver WLDR(i) that supplies the voltage to be applied to the word line WL(i), and a control gate driver CGDR(i) that supplies the voltage to be applied to the control gate line CGL(i). Finally, a last modification to the memory array is that the gates of the control gate transistors of a same column C(k) are linked to a common column selection line CSL(k) that thus replaces the classic control gate line CGL(k) (refer to FIG. 2). The line CSL(k) is driven by the column latch CL(k), which applies to it a voltage equal to 0, Vc+ or Vp2 depending on the case, as this will now be described. The voltage Vc+ is a gate voltage that enables the voltage #Vc to be let through a transistor and is for example equal to 7 V if #Vc is equal to 4 V.

a—Programming Memory Cells

Figure 8:
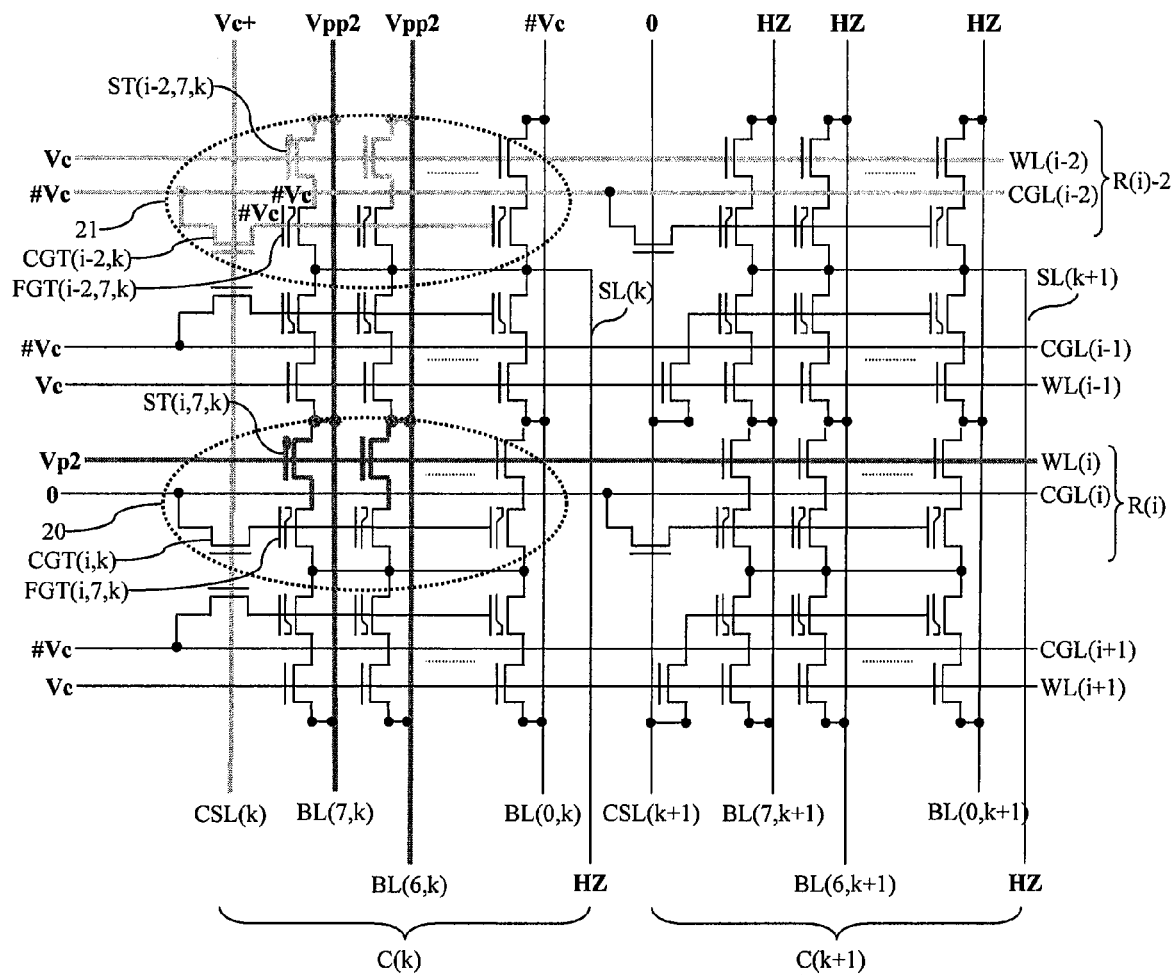
FIGS. 8 and 9 represent combinations of voltages according to the present invention applied to the EEPROM memory in FIG. 7, respectively during a phase of programming and a phase of erasing memory cells.

FIG. 8 represents a combination of voltages according to the present invention applied to the memory array in FIG. 7 to program memory cells. The memory cells to be programmed chosen as an example are the memory cells of respective ranks i,7,k and i,6,k belonging to the memory word 20.

The following voltages can be distinguished:
voltage applied to the word line in question WL(i): Vp2
voltage applied to the other word lines of the memory array, for example the word line WL(i−2): Vc
voltage applied to the bit lines in question BL(7,k), BL(6,k): Vpp2
voltage applied to the other bit lines of the column in question C(k), for example the bit line BL(0,k): #Vc
voltage applied to the other bit lines of the memory array: HZ
voltage applied to the control gate line in question CGL(i): 0 V
voltage applied to the other control gate lines of the memory array, for example the control gate line CGL(i−2): #Vc
voltage applied to the selection line CSL(k) of the column in question C(k): Vc+,
voltage applied to the other selection lines CSL(k) of the memory array: 0 V
voltage applied to the source line SL(k) in question: HZ
voltage applied to the other source lines SL(k) of the memory array: HZ.

The selection transistors ST(i,7,k), ST(i,6,k) of the two memory cells in question are in the transmission state and apply the voltage Vpp2 to the drains of the floating-gate transistors FGT(i,7,k), FGT(i,6,k), the gate of which receives the voltage 0 V, the sources having a high impedance.

Simultaneously, in the other memory cells linked to the bit lines in question BL(7,k), BL(6,k):

1) the selection transistors ST receive the voltage Vpp2 on their drain and the compensation voltage Vc on their gate, for example the transistor ST(i−2,7,k) of the line WL(i−2). These transistors have a breakdown threshold increased by 2 V (Vpp2−Vpp1).

2) the floating-gate transistors FGT receive the voltage #Vc on their drain and the voltage #Vc on their gate and the risk of soft programming of these transistors is therefore removed.

b—Erasing Memory Cells

Figure 9:
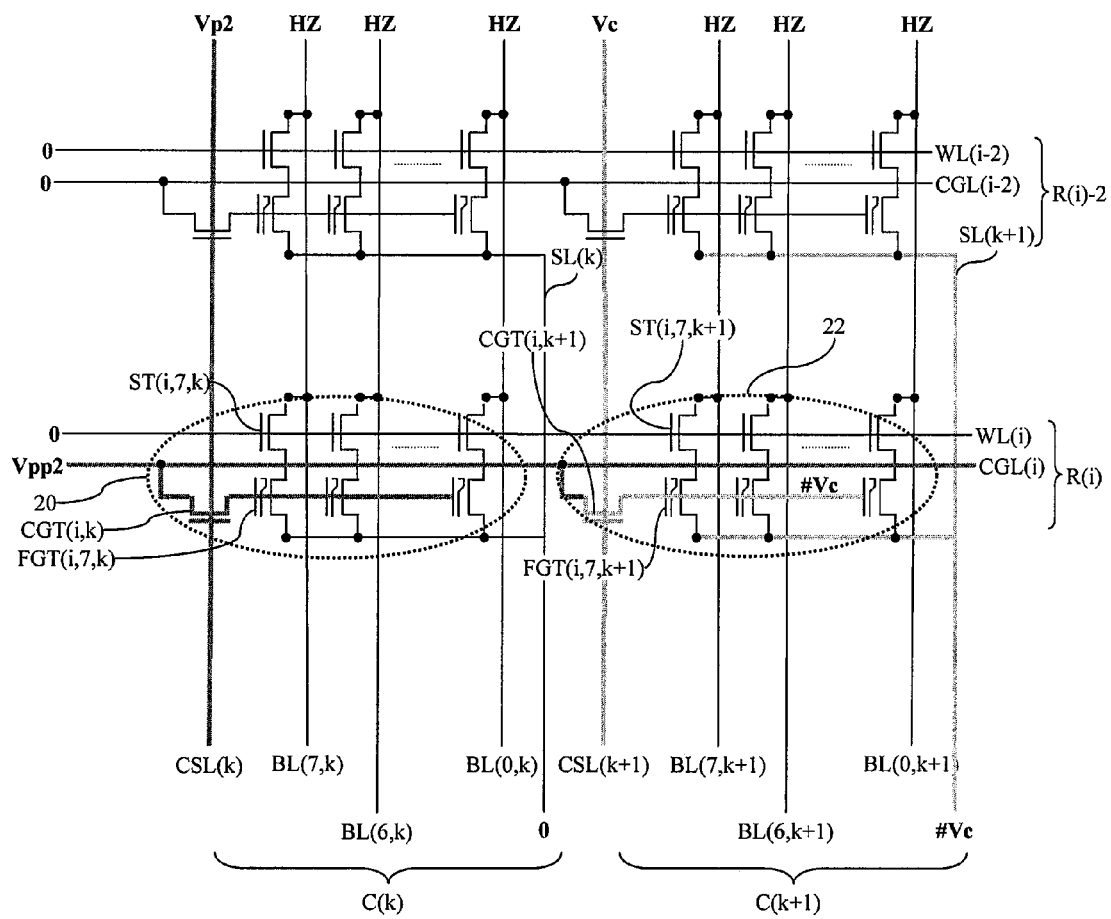

FIG. 9 represents a combination of voltages according to the present invention applied to the memory array in FIG. 7 to erase memory cells. The memory cells to be erased chosen as an example are the memory cells of the memory word 20. The rows R(i−1) and R(i+1) are not represented for the sake of readability of the drawing.

The following voltages can be distinguished:
voltage applied to all the word lines of the memory array, for example WL(i) and WL(i−2): 0 V
voltage applied to all the bit lines of the memory array, all columns taken together: HZ
voltage applied to the control gate line in question CGL(i): Vpp2
voltage applied to the other control gate lines of the memory array, for example the control gate line CGL(i−2): 0 V
voltage applied to the selection line CSL(k) of the column in question C(k): Vp2,
voltage applied to the other selection lines CSL(k) of the memory array: 0 V
voltage applied to the source line SL(k) of the column in question: 0 V
voltage applied to the other source lines of the memory array: #Vc.

As above, the control gate transistor CGT(i,k) of the memory word 20 is in the transmission state and applies the voltage Vpp2 to the gates of the floating-gate transistors of the memory word, the drain of which is put to high impedance and the sources of which are on 0 V.

Simultaneously, in the other memory cells belonging to the same row R(i), for example the memory cells of a memory word 22 belonging to the column C(k+1):

1) the selection transistors ST receive the voltage 0 V on their gate and their drain has a high impedance, these transistors are therefore off, 2) the control gate transistor CGT(i,k+1) receives the voltage Vpp2 but receives the compensation voltage Vc on its gate via the selection line CLS(k+1), such that the breakdown threshold of this transistor is increased by 2 V, 3) the floating-gate transistors FGT of the memory word 22 receive the voltage #Vc on their gate and the voltage #Vc on their source (via the source line SL(k+1) and the risk of a soft erase of these transistors is therefore removed.

Other Applications of the Method According to the Present Disclosure

The method according to the present disclosure has been initially designed to apply to word-erasable memories. Similarly, the memory array that has just been described has been designed to enable a simple implementation of the method without requiring the addition of an excessive number of additional transistors for switching the compensation and inhibition voltages. However, it will be understood by those skilled in the art that the present disclosure is also applicable to various other types of memory and memory array architectures. In particular, it can be applied to a memory array devoid of any control gate transistor, in which all the memory cells of a row R(i), R(i−1), R(i−2), etc. are erased simultaneously (called page-erasing). In this case, the control gates of the floating-gate transistors of each row are directly connected to the control gate line of the row in question, for example CGL(i) for the memory cells of the row R(i), and the row decoder RDEC directly applies the voltage Vpp2 to these transistors during a phase of erasing the page. As a result, the problem linked to the breakdown threshold of the control gate transistors is solved by itself due to the removal of these transistors, but the method according to the present disclosure remains applicable to the programming phase in the configuration represented in FIG. 8 in which the control gate transistors would have been removed. In this case, the voltage #Vc is directly applied to the control gates of the floating-gate transistors by the decoder RDEC, through the control gate lines CGL.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for programming or erasing memory cells each including a selection transistor connected to a floating-gate transistor, each transistor having a gate, a first conduction terminal and a second conduction terminal, the method comprising:
a step of simultaneously applying one of a high programming and an erase voltage to at least one memory cell that must be programmed or that must be erased and to a terminal of at least one transistor not involved in the programming or erasing process;
applying a non-zero compensation voltage to the gate of the transistor not involved in the programming or erasing process, so as to increase a breakdown threshold of the transistor; and
applying an inhibition voltage to the gate or to a terminal of at least one floating-gate transistor connected to the transistor having its breakdown threshold increased to inhibit a phenomenon of soft programming or soft erase of the floating-gate transistor.

2. The method according to claim 1 wherein the step of programming comprises the steps of:
applying a high programming voltage to the first terminal of at least one first selection transistor belonging to a memory cell that must be programmed and to the first terminal of at least one second selection transistor belonging to a memory cell that must not be programmed;
applying the compensation voltage to the gate of the second selection transistor, so as to increase the breakdown threshold of the transistor; and
applying a soft programming inhibition voltage to the gate of a floating-gate transistor linked to the second selection transistor.

3. The method according to claim 1, applied to a memory in which the memory cells are arranged in memory words, each memory word having a control gate transistor connected to the control gates of the floating-gate transistors of the word, and wherein the step of erasing comprises the steps of:
applying a high erase voltage to the first terminal of at least one first control gate transistor of a first memory word that must be erased and to the first terminal of at least one second control gate transistor of a second memory word that must not be erased;
applying the compensation voltage to the gate of the second control gate transistor, so as to increase the breakdown threshold of the transistor; and
applying a soft erase inhibition voltage to terminals of the floating-gate transistors of the second memory word.

4. The method according to claim 1, comprising a step of arranging the memory cells to form a memory array having the following characteristics:
the memory cells are arranged according to rows;
the gates of the selection transistors of the memory cells of a same row are connected to a common word line;
the first terminals of the selection transistors of the memory cells are linked to bit lines transversal to the word lines;
the bit lines are grouped together into columns;
the memory cells of a same column and of a same row form a memory word;
each memory word comprises a control gate transistor having its first terminal connected to the control gates of the floating-gate transistors of the word;
the gates of the control gate transistors of the memory words belonging to a same column are connected to a common column selection line; and
the first terminals of the control gate transistors of the memory words belonging to a same row are linked to a common control gate line that is parallel to the word line of the row.

5. The method according to claim 4, comprising a step of connecting the second terminals of the floating-gate transistors of each column to a control line common to all the floating-gate transistors of the column.

6. An electrically erasable and programmable memory, comprising:
memory cells each comprising a selection transistor connected to a floating-gate transistor, each transistor comprising a gate, a first conduction terminal and a second conduction terminal; and
means for simultaneously applying a high programming or erase voltage to at least one memory cell that must be programmed or that must be erased and to a terminal of at least one transistor not involved in the programming or erasing process; and
means for applying a non-zero compensation voltage to the gate of the transistor not involved in the programming or erasing process, so as to increase a breakdown threshold of the transistor, and applying an inhibition voltage to the gate or to a terminal of at least one floating-gate transistor connected to the transistor having its breakdown threshold increased, to inhibit a phenomenon of soft programming or soft erase of the floating-gate transistor.

7. The memory according to claim 6, comprising programming means arranged for:
applying a high programming voltage to the first terminal of at least one first selection transistor belonging to a memory cell that must be programmed and to the first terminal of at least one second selection transistor belonging to a memory cell that must not be programmed;
applying the compensation voltage to the gate of the second selection transistor, so as to increase the breakdown threshold of the transistor; and
applying a soft programming inhibition voltage to the gate of a floating-gate transistor linked to the second selection transistor.

8. The memory according to claim 6 wherein the gates of the selection transistors of the memory cells are connected to word lines, the memory cells are arranged in memory words, each memory word including a control gate transistor connected to the control gates of the floating-gate transistors of the word, and comprising means for erasing memory cells arranged for:
applying a high erase voltage to the first terminal of at least one first control gate transistor of a first memory word that must be erased and to the first terminal of at least one second control gate transistor of a second memory word that must not be erased;
applying the compensation voltage to the gate of the second control gate transistor, so as to increase the breakdown threshold of the transistor; and
applying a soft erase inhibition voltage to terminals of the floating-gate transistors of the second memory word.

9. The memory according to claim 6 wherein the memory cells are arranged in a memory array having the following structural characteristics:
the memory cells are arranged according to rows;
the gates of the selection transistors of the memory cells of a same row are connected to a common word line;
the first terminals of the selection transistors of the memory cells are linked to bit lines transversal to the word lines;
the bit lines are grouped together into columns;
the memory cells of a same column and of a same row form a memory word;
each memory word comprises a control gate transistor having its first terminal connected to the control gates of the floating-gate transistors of the word;
the gates of the control gate transistors of the memory words belonging to a same column are connected to a common column selection line; and
the first terminals of the control gate transistors of the memory words belonging to a same row are linked to a common control gate line that is parallel to the word line of the row.

10. The memory according to claim 9 wherein the second terminals of the floating-gate transistors of each column are connected to a control line common to all the floating-gate transistors of the column.

11. A method for programming and erasing memory cells that have a selection transistor connected to a floating gate transistor, the method comprising applying a non-zero compensation voltage to the gate of a transistor not involved in the programming or erasing process, the non-zero compensation voltage adapted to increase a breakdown threshold of the transistor; and
applying an inhibition voltage to a gate of at least one floating gate transistor connected to the transistor having its breakdown threshold increased to program the floating gate transistor or applying an inhibition voltage to a terminal of at least one floating gate transistor connected to the transistor having its breakdown threshold voltage increased to inhibit a soft erase of the floating gate transistor.

12. The method of claim 11 wherein the memory cell is part of a memory word having a plurality of memory cells, each memory word having a control gate transistor connected to the control gates of the floating gate transistors of the word, and wherein erasing comprises:
- applying an erase voltage to a first terminal of at least one first control gate transistor of the memory word to be erased and to a first terminal of at least one second control gate transistor of a second memory word that must not be erased;
- applying a compensation voltage to the gate of the second control gate transistor to increase the breakdown threshold of the transistor; and
- applying a soft erase inhibition voltage to terminals of the floating gate transistors of the second memory word.

13. The method of claim 12 wherein a step of programming comprises applying a high programming voltage to a first terminal of the selection transistor belonging to the memory cell to be programmed and to the first terminal of at least one second selection transistor belonging to a memory cell in the memory word that must not be programmed;
- and applying the compensation voltage to the gate of the second selection transistor so as to increase the breakdown threshold of the selection transistor; and
- applying a soft programming inhibition voltage to the gate of a floating gate transistor linked to the second selection transistor.

14. The method of claim 13 wherein the high programming and erase voltages are greater than the compensation voltage, and the soft programming inhibition voltage having a value of the compensation voltage less the threshold voltage of the transistor to which it is applied.

15. The method of claim 13, comprising connecting second terminals of the floating gate transistors in a column of floating gate transistors to a control line common to all floating gate transistors of the column.

16. An electrically erasable and programmable memory, comprising:
- a plurality of memory cells, each memory cell comprising a selection transistor coupled to a floating gate transistor, each of the selection and floating gate transistors comprising a gate, a first conduction terminal, and a second conduction terminal; and
- a circuit for simultaneously applying a high-programming voltage and an erase voltage to at least one memory cell that is to be programmed or that is to be erased, and to a terminal of at least one transistor not involved in the programming and erasing processes, the circuit adapted to apply a non-zero compensation voltage to the gate of the transistor not involved in the programming or in the erasing process in order to increase a breakdown threshold of the transistor and to apply an inhibition voltage to the gate of at least one floating gate transistor connected to the transistor having its breakdown threshold increased in order to inhibit a phenomenon of soft programming and, during the erasing process, applying the inhibition voltage to a conduction terminal of the at least one floating gate transistor connected to the transistor having its breakdown threshold increased to inhibit soft erase of the floating gate transistor.

17. The memory of claim 16, comprising a programming circuit adapted to apply a high programming voltage to the first terminal of at least one first selection transistor belonging to a memory cell to be programmed and to the first terminal of at least one second selection transistor belonging to a memory cell that must not be programmed;
- applying the compensation voltage to the gate of the second selection transistor to increase the breakdown threshold of the second selection transistor; and
- applying a soft programming inhibition voltage to the gate of the floating gate transistor that is linked to the second selection transistor.

18. The memory of claim 16 wherein the gates of the selection transistors of the memory cells are connected to word lines, the memory cells are arranged in memory words with each memory word having a control gate transistor connected to the control gates of the floating gate transistors of the word, and further comprising a circuit for erasing memory cells, the circuit adapted to:
- apply a high erase voltage to the first terminal of at least one first control gate transistor of a first memory word to be erased and to the first terminal of at least one first second control gate transistor of a second memory word that is not to be erased;
- applying the compensation voltage to the gate of the second control gate transistor to increase the breakdown threshold of the second control gate transistor; and
- applying a soft erase inhibition voltage to terminals of the floating gate transistor of the second memory word.

19. The memory of claim 18 wherein the second terminals of the floating gate transistors belonging to a column are connected to a control line common to all floating gate transistors of the column.

* * * * *

UNITED STATES PATENT AND TRADEMARK OFFICE
CERTIFICATE OF CORRECTION

| | |
|---|---|
| PATENT NO. | : 7,492,639 B2 |
| APPLICATION NO. | : 11/754707 |
| DATED | : February 17, 2009 |
| INVENTOR(S) | : Francesco La Rosa |

It is certified that error appears in the above-identified patent and that said Letters Patent is hereby corrected as shown below:

Column 8, Line 5:
"a row decoder RDC1 to bias the word lines WL(i) and" should read, --a row decoder RDEC to bias the word lines WL(i) and--.

Column 17, Line 28:
"the compensation voltage less the threshold voltage of the" should read, --the compensation voltage less than the threshold voltage of the--.

Column 17, Line 41:
"a circuit for simultaneously applying a high-programming" should read, --a circuit for simultaneously applying one of a high-programming--.

Signed and Sealed this
Twenty-seventh Day of November, 2012

David J. Kappos
*Director of the United States Patent and Trademark Office*